United States Patent [19]

Hosoda et al.

[11] Patent Number: 4,715,637
[45] Date of Patent: Dec. 29, 1987

[54] GRIP DEVICE FOR SHEET-LIKE OBJECTS

[75] Inventors: Yuji Hosoda, Chiyoda; Kazuo Honma, Ami; Masakatsu Fujie, Ushiku, all of Japan

[73] Assignee: Hitachi, Ltd., Tokyo, Japan

[21] Appl. No.: 853,450

[22] Filed: Apr. 17, 1986

[30] Foreign Application Priority Data

| Apr. 17, 1985 | [JP] | Japan | 60-80110 |
| Apr. 17, 1985 | [JP] | Japan | 60-80111 |
| Apr. 19, 1985 | [JP] | Japan | 60-82309 |

[51] Int. Cl.$^4$ .......................... B25J 15/04; B66C 1/10
[52] U.S. Cl. .................... 294/86.4; 294/106; 401/30; 401/39
[58] Field of Search ............... 294/86.4, 88, 92, 98.1, 294/119.3, 87.1, 106, 907; 414/730, 735, 729; 901/30, 33, 39

[56] References Cited

FOREIGN PATENT DOCUMENTS

| 2104696 | 7/1970  | France  | 294/86.4 |
| 128632  | 6/1958  | Sweden  | 294/86.4 |
| 662344  | 5/1979  | U.S.S.R. | 294/86.4 |
| 727426  | 4/1980  | U.S.S.R. | 294/86.4 |
| 889591  | 12/1981 | U.S.S.R. | 294/86.4 |

Primary Examiner—James B. Marbert
Attorney, Agent, or Firm—Antonelli, Terry & Wands

[57] ABSTRACT

A gripping device for gripping an outer peripheral edge of an object to be grasped such as, for example, a semiconductor wafer, with the gripping device including a base, gripping members for gripping the object to be grasped, elastic members disposed between the base and the grip members so as to urge the respective grip members in an opening or closing direction. A driver for the grip members is provided, with the driver being fashioned as a linear or flat shape memory alloy member which is connected across the grip members.

24 Claims, 25 Drawing Figures

GRIP DEVICE FOR SHEET-LIKE OBJECTS

BACKGROUND OF THE INVENTION

The present invention relates to a grip device and, more particularly, to a grip device for grasping and conveying a sheet-like object such as, for example, a semiconductor wafer.

With regard to the handling of sheet-like objects to be grasped, such as, for example, semiconductor wafers, various measures have been proposed in, for example, Japanese Patent Application Laid Open Nos. 58-75844 and 58-155736, which include a system for handling the object by vacuum suction and a system for grasping an outer peripheral edge of the object for the purpose of preventing deleterious or harmful matters such as, for example, dust from adhering to the semiconductor wafer.

Since the grip devices of the above proposed type include slide portions such as, for example, a pin coupling an a sliding surface which form sources of contamination such as dust, in actual practice, the proposed grip devices cannot maintain high degrees of cleanliness or freedom from contamination of the surfaces of the semiconductor wafers.

In, for example, a publication entitled "Report of Investigation and Researches on Developments of Applications of Shape Memory Alloys'", pages 110-111, Osaka Science and Technology Center in Japan, Committee on Investigation and Researches on Developments of Applications of Shape Memory Alloys, March, 1983, a grip device for grasping an object in ordinary atmosphere has been proposed, which grip device opens and closes grip members due to a combination between a bias spring and a shape memory alloy member in the form of a coiled spring. With this proposed grip device, the structure around the shape memory alloy member, formed into the coiled spring, is complicated and the use of the grip device in a clean environment is not taken into consideration. Moreover, since the shape of the memory alloy is in the form of a coiled spring, the cooling efficiency thereof is inferior, and the opening and closing operation of the grip members of the grip device is relatively slow so that the device is not suitable for the handling of objects requiring high speed operation.

The aim underlying the present invention essentially resides in providing a grip device for producing little, if any, contaminants or deleterious substances such as, for example, dust, with the grip device including grip members which open and close with high accuracy and with a good response time.

In accordance with advantageous features of the present invention, a grip device is provided wherein an outer peripheral edge of a flat objected to be grasped is gripped at a place to be gripped, with the grip members of the grip device being attached to a base of the grip device by elastic members for urging the corresponding grip members in an opening direction or a closing direction. Additionally, a linear or flat driver means, fashioned of a shape memory alloy, is disposed across the grip members of the grip device.

By virtue of the features of the present invention, it is possible to dispense with the provision of any slide portions so that a grip device producing little if any contaminants such as dust can readily be realized. Moreover, since the shape memory alloy, serving as the driving means of the grip members, is linear or flat, heating and cooling speeds thereof become relatively high so that the response time or responsiveness of the opening and closing operations of the grip members can be significantly enhanced.

Other objects, features, and advantages of the present invention will become more apparent from the following description when taken in connection with the accompanying drawings.

DETAILED DESCRIPTION

Figure 1:
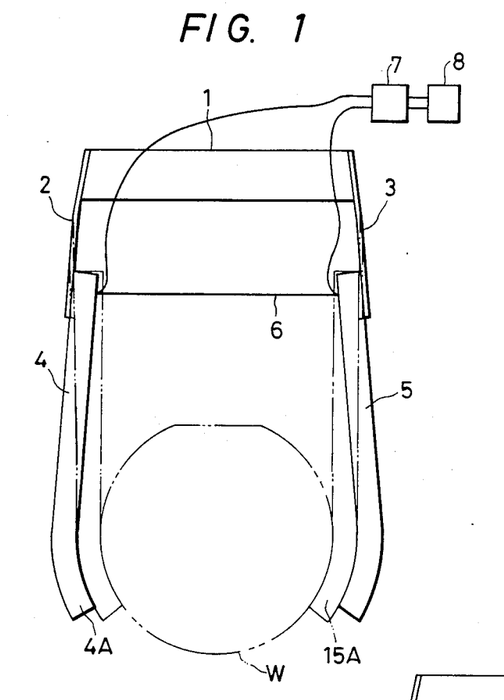
FIGS. 1-4 are front views respectively showing an embodiment of a grip device constructed in accordance with the present invention.

Referring now to the drawings wherein like reference numerals are used throughout the various views and, more particularly, to FIG. 1, according to this figure, a grip device, constructed in accordance with the present invention, includes a base 1 installed or disposed, for example, on an end of a robot arm (not shown), with the grip device being adapted to grip a sheet-like object such as, for example, a semiconductor wafer W. An elastic member 2, 3 is mounted at respective sides of the base 1 with grip members 4, 5 being respectively attached or secured to outer free ends of the elastic members 2, 3. The distal or free ends of the respective grip members 4, 5 are formed with holding portions 4A, 5A which hold the lower peripheral edge of the object to be grasped which, in the illustrated embodiments of the present invention is represented by a semiconductor wafer w. A linear member 6, of a shape memory alloy, serving as a driver for opening and closing the grip members 4, 5 is disposed across the grip members 4, 5, with the shape memory alloy member 6 memorizing its shape so that, when heated, the shape memory alloy generates recovering or restoring forces to reduce a length thereof. The shape memory alloy member 6 is connected to a power source 8 through a switch means 7, and the elastic members 2, 3 are endowed with initial flexures for urging the grip members 4, 5 in an opening direction.

FIG. 1, in solid line, provides an illustration of the position of the gripping device for grasping the wafer w with the elements in an ungripped or ungrasped state. When heated, the shape memory alloy member 6 generates the recovery or restoring forces against the forces of deformation of the elastic members 2, 3 and draws the grip members 4, 5 toward each other. As a result, the grip members 4, 5 nip or grasp the semiconductor wafer W in the manner indicated in phantom lines in FIG. 1, whereby the holders 4A, 5A hold the lower peripheral edge of the wafer w without applying high or considerable pressing forces to the wafer w.

Subsequently, when the wafer W, having been shifted to a desired position, is to be placed on a jig (not shown) or the like, the shape memory alloy member 6 is cooled in a manner contrary to the above-noted heating operation and then the shape memory alloy member 6 has the recovery forces thereof lowered so that the grip members 4, 5 are opened by deformation forces of the elastic members 2, 3 so as to release the wafer W. Thus, the wafer W can be placed on the jig or the like.

By virtue of the above-noted constructional features of the present invention, little if any contamination such as, for example, dust or the like is produced from the grip device during the gripping operation of the wafer W, so that the wafer W is free from the adhesion of dust and can be cleanly handled. Additionally, since the shape memory alloy member 6 for opening and closing the grip member 4, 5 is linear, the heating and cooling speeds thereof are high, thereby resulting in a highly favorable responsiveness or response time during opening and closing operations of the grip members 4, 5.

Figure 2:
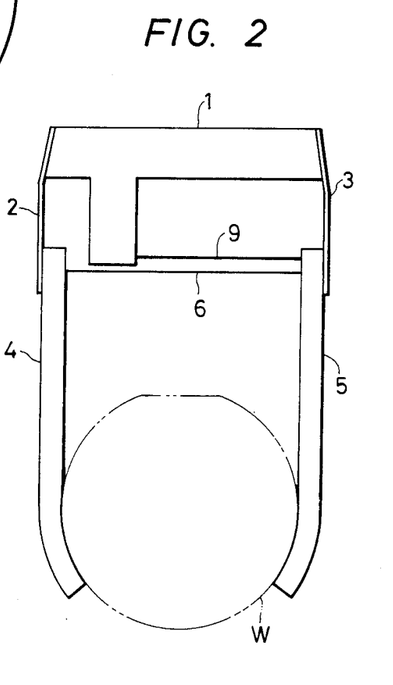

In the grip device of FIG. 2, a shape memory alloy member 9 is disposed across the base 1 and the grip members 5 whereby, when the spring characteristics of the elastic members 2, 3 differ due to, for example, manufacturing deviation between the respective elastic members 2, 3, the deviation of the grip position of the wafer W gripped by the grip members 4, 5 that is, the deviation thereof within the plane of the sheet of FIG. 2 can be corrected by the heating and cooling of the shape memory alloy member 9. Additionally, where the spring characteristics of the elastic members 2, 3 are substantially the same, the wafer W, gripped by the grip members 4, 5 can be moved to the right of left relative to the plane of the sheet of FIG. 2 by the heating and cooling of the shape memory alloy member 9.

Figure 3:
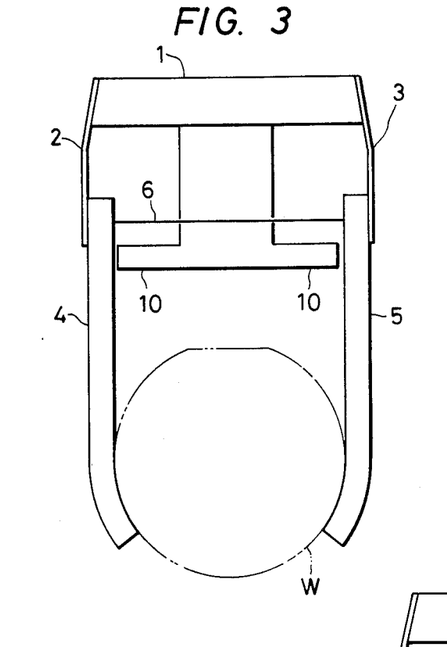

In the grip device of FIG. 3, the base 1 is provided with stopper means 10 for limiting or restraining the magnitudes or displacement of the grip members during a closing operation. With a construction such as shown in FIG. 3, when the wafer W is to be gripped by the grip members 4, 5, the interval between the grip members 4, 5 can be predetermined and maintained constant without depending upon the recovery forces of the shape memory alloy member 6. Consequently, the grip members 4, 5 may grasp the wafer W with fixed clearances therefrom, and the grip members 4, 5 do not apply useless grasping forces to the wafer W.

Figure 4:
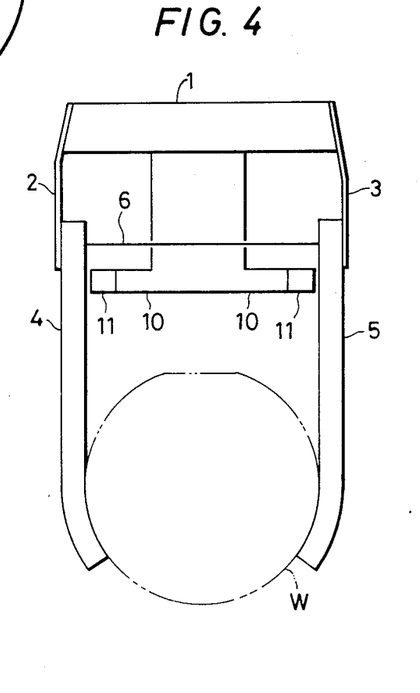

As shown in FIG. 4, the gripping device includes cushion members 11 mounted on end faces of the stopper means 10. With this construction, when the wafer W is to be gripped by the grip members 4, 5, the grip members 4, 5 collide or are brought into abutment with the cushion members 11, whereby the production of, for example, dust, at the time of collision can be reduced. Moreover, the clearances between the wafer W and the grip members 4, 5 can be adjusted by changing the recovery forces of the shape memory alloy member 6, and it is also possible to nip or grasp the wafer W with predetermined specified forces.

In the above described gripping devices of FIGS. 1-4, the initial flexures of the elastic members 2, 3 are afforded in the opening direction of the grip members 4, 5, while the grip members 4, 5 are operated to execute a closing operation by the tractive recovery forces of the shape memory alloy member 6. However, it is also possible to establish a reverse characteristic wherein the initial flexures of the elastic members 2, 3 are afforded in the closing direction of the grip members 4, 5, while the grip members 4, 5 are operated to execute an opening operation by compressive recovery forces of the shape memory alloy member 6.

Figure 5:
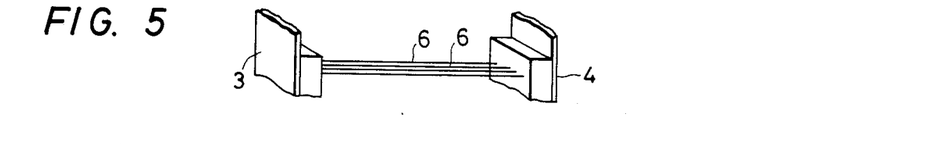
FIGS. 5-12 are perspective views respectively showing embodiments of shape memory alloy members for grip devices constructed in accordance with the present invention.
Figure 6:
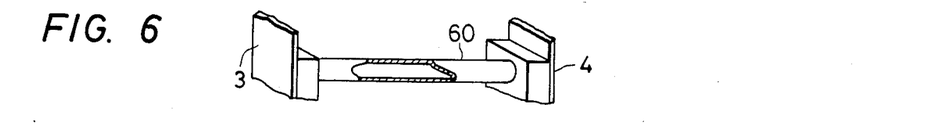
Figure 7:
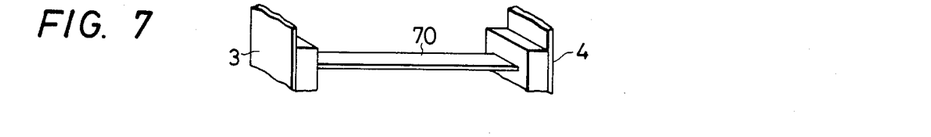
Figure 8:
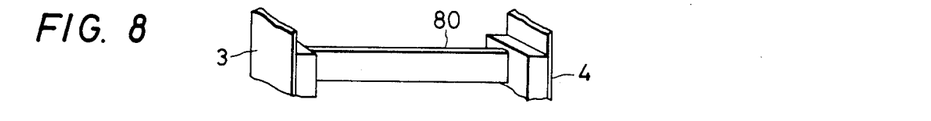

Each of the shape memory alloy members 6, 9 are not restricted to a single linear member and, for example, a plurality of linear members 6, of a shape memory alloy may be employed as shown most clearly in FIG. 5. It is also possible as shown in FIG. 6, to provide a pipe-configured shape memory alloy member 60 when cooling factors are to be taken into consideration. As shown in FIGS. 7 and 8, the shape memory alloy member may be fashioned as a flat member 70 or 80 arranged either horizontally or vertically.

Figure 9:
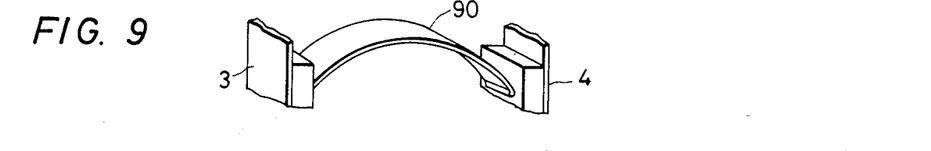
Figure 10:
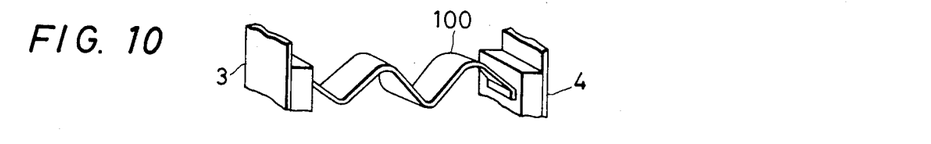
Figure 11:
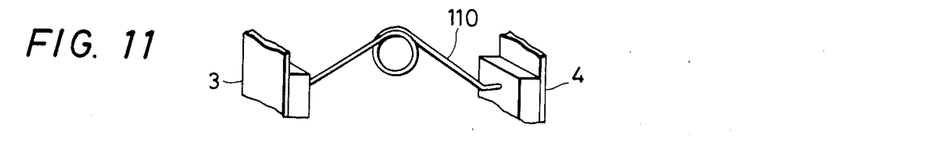
Figure 12:
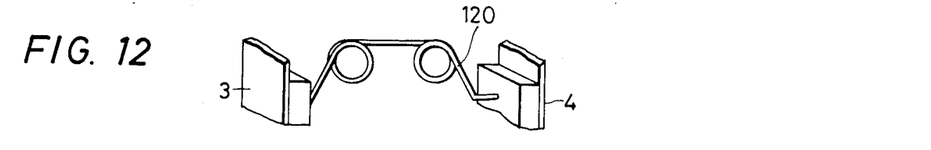

To increase movement magnitudes of the grip members 4, 5 and/or a third holder member by using a shape memory alloy, it is possible, as shown in FIG. 9, to employ a curved flat member 90, a corrugated flat member 100 as shown in FIG. 10, or a linear member 110 or 120 having one or two loop parts as shown in FIG. 11 or FIG. 12, respectively.

Figure 13:
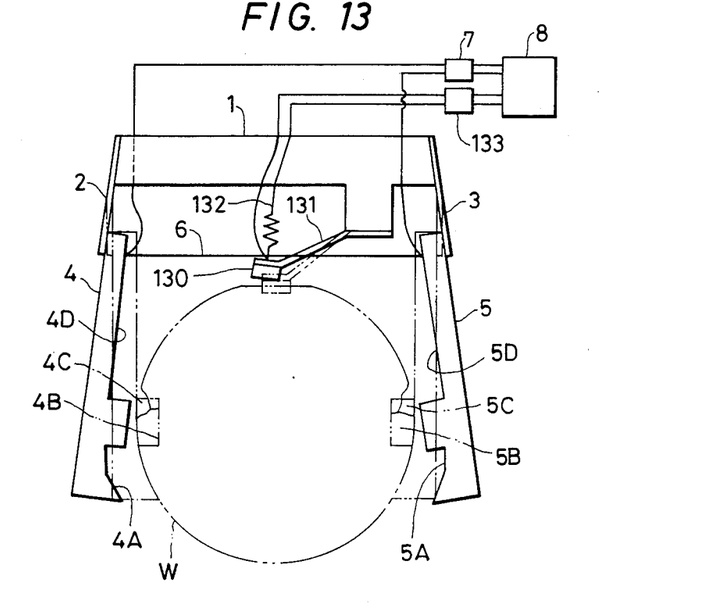
FIGS. 13-18 are front views respectively showing still further embodiments of a grip device constructed in accordance with the present invention.

In the grip device of FIG. 13, a sheet-like object to be grasped such as, for example, a semiconductor wafer W includes a base 1 installed on, for example, an end of an arm of a robot (not shown). Respective ends of the base 1 have attached or mounted thereon corresponding elastic members 2 or 3, with respective grip members 4a, 5a, being attached to the free ends of the elastic members 2, 3. The distal or free ends of the grip members 4a, 5a are respectively provided with first holding portions 14A, 15A for holding the lower peripheral edge of the wafer W, second holding portions 4B, 4C and 5B, 5C, for holding the peripheral edge plane of the wafer W, and portions 4D, 5D for permitting an upward movement of the wafer W. A linear member 6 of a shape memory alloy, serving as a driver for opening and closing the grip members 4a, 5a, is disposed across the grip members 4a, 5a. The shape memory alloy member 6 memorizes a shape so that, when heated, it generates forces of recovery reducing the length thereof. The shape memory alloy member 6 is connected to a power source 8 through a switch 7 as described hereinabove in connection with FIGS. 1-4. The elastic members 2, 3 are provided with initial flexures for urging the grip members 4a, 5a in the opening direction. A holder 130, forming a third holding portion or member for holding an upper peripheral edge of the wafer W, is disposed between the grip members 4a, 5a and under the base 1. The holder member 130 is suspended from the base 1 by an elastic member 131, with a linear member 132 of a shape memory alloy being interposed between the holder 130 and the base 1, with the linear member 132 being adapted to push the wafer W toward the distal ends of the grip members 4a, 5a. The linear shape memory alloy member 132 memorizes its shape so that, when heated, it generates forces of recovery reducing its length, with the linear shape memory alloy member 132 being connected to the power source 8 through a switch 133. The elastic member 131 is endowed with initial flexure in a direction for pressing the holder 130 against the wafer W.

The solid line position of the grip members 4a, 5a, in FIG. 13 illustrates a relationship between the wafer W and the grip members 4a, 5a in an ungrasped state of the wafer W. At this time, the linear shape memory alloy member 132 is held heated to generate the recovery forces against the force of deformation of the elastic member 131 and to draw the holder 130 toward the base 1. When the shape memory alloy member 6 is heated in this state, it generates the recovery forces against the forces of deformation of the elastic members 2, 3 and draws both the grip members 4a, 5a together. As a result, the grip members 4a, 5a nip the wafer W in such a manner that, as indicated in phantom line in FIG. 13, the first holder portions 14A, 15A hold the lower peripheral edge of the object W without applying great pressing forces to the wafer W. When the linear shape memory alloy member 132 is subsequently cooled, the recovery forces thereof are lowered so that the holder member 130 is brought into touch or contact with the upper peripheral edge of the wafer W by virtue of the deformation force of the elastic member 131 to press the wafer W toward the distal ends of the grip members 4a, 5a. Thus, the wafer W to be grasped is reliably nipped inside the grip members 4a, 5a and can therefore be conveyed to a desired position by movement of the arm of the robot (not shown) while holding or maintaining any desired attitude such as a vertical or horizontal attitude.

When the wafer W has been conveyed to a desired position and is to be placed on a jig or the like, the shape memory alloy member 132 is heated contrariwise to the above operation. Then the shape memory alloy member 132 generates the recovery forces against the deformation force of the elastic member 131 and draws the holder member 130 toward the base 1. Therefore, the pressing of the wafer W toward the distal ends of the grip members 4a, 5a is released, and the wafer W is allowed to move upwards along the movement permitting portion 4D, 5D of the grip members 4a, 5a. Subsequently, the grip device is caused to descend with a colliding speed between the wafer W and the jig taken into consideration, until the wafer W falls on the jig. At this time the wafer W moves along the movement permitting portions 4D, 5D of the respective grip members 4a, 5a and can fall without undergoing any great collision. When the shape memory alloy 6 is thereafter cooled, the grip members 4a, 5a are opened by the deformation forces of the elastic members 2, 3 to release the wafer W. Thus, the wafer W can be placed on the jig or the like.

By virtue of the construction of the gripping device of FIG. 13, the wafer W can be gripped without exerting any unreasonable force thereon and yet it can be conveyed in any desired attitude. Futhermore, the wafer W undergoes a slight impact at the fall on the jig and can be caused to fall stably.

Figure 14:
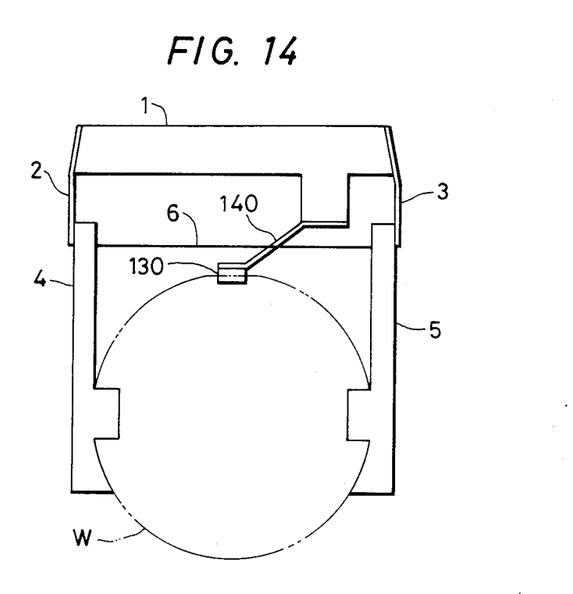

In the gripping device of FIG. 14, the holder member 130, forming the third holding portion, is suspended from the base 1, as in the gripping device of FIG. 13, through a member 140 of a shape memory alloy having a two-way shape memory effect, with the shape memory alloy being, for example, a nickel-titanium (Ni-Ti) alloy. The holder member 130 is pressed against the wafer W or is released therefrom by a change between a memory shape at temperatures higher than a certain point and a memory shape at lower temperatures memorized in the shape memory alloy member 140.

With a construction of a gripping device such as shown in FIG. 14, as in the gripping device of FIG. 13, the wafer W can be gripped without any unreasonable force and the wafer W can be caused to fall without any shock. Moreover, according to the gripping device of FIG. 14, the drive means for the holder member 130 can be simplified as compared to the drive means for the holder 130 in the gripping device of FIG. 13.

Figure 15:
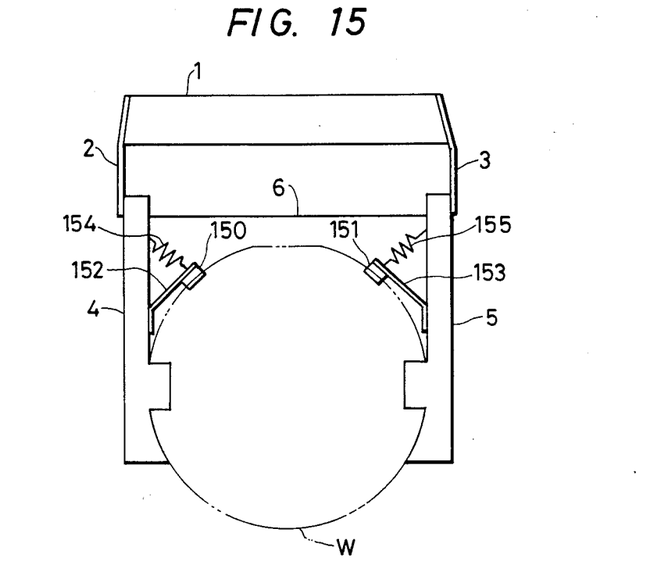

In the gripping device of FIG. 15, the third holding portion includes two holder members 150, 151 which are adapted to touch or contact two portions of the upper peripheral edge of the wafer W, with the holder members 150, 151 being respectively supported by elastic members 152, 153 on the grip members 4a, 5a. Members 154, 155 of a shape memory alloy, are respectively extended across the elastic members 152, 153 and the grip members 4a, 5a in order to drive or urge the holder members 150, 151 against the elastic members 152, 153.

With a construction of a gripping device such as shown in FIG. 15, the holder members 150, 151 can apply pressing forces to the wafer W gripped by the gripping members 4a, 5a or release the grip members 4a, 5a through heating or cooling of the shape memory alloy members 154, 155. Moreover, since the holder members 150, 151 exert the pressing forces toward a central part of the gripped wafer W, a positional deviation of the wafer W inside of the grip members 4a, 5a can be suppressed. Furthermore, as with the above described gripping devices, the gripping device of FIG. 15 can grip the wafer W without any unreasonable force and can cause the wafer W to fall without applying any shock.

Figure 16:
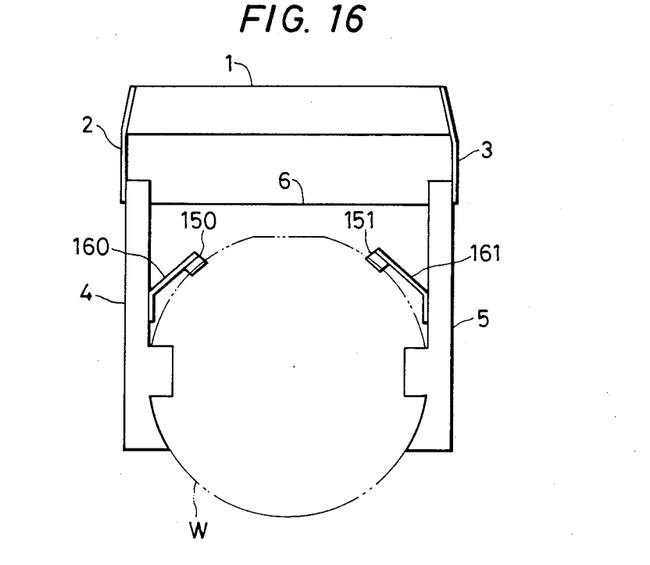

In the embodiment of FIG. 16, the holder members 150, 151, forming the third holding portion, are supported by the respective grip members 4a, 5a through members 160, 161 of a shape memory alloy having a two-way shape memory effect, with the shape memory alloy being, for example, a nickel-titanium (Ni-Ti) alloy. The holder members 150, 151 are pressed against the wafer W or are released therefrom by a change between the memory shapes at temperatures higher than a predetermined point and memory shapes at lower temperatures memorized in the shape memory alloy members 160, 161. By virtue of the constructional features of the gripping device of FIG. 16, the same effects as set forth in connection with the above described gripping devices of the present invention can be attained, and the drive mechanisms for the holder members 150, 151 can be simplified to a greater extent than the gripping device shown in FIG. 15.

Figure 17:
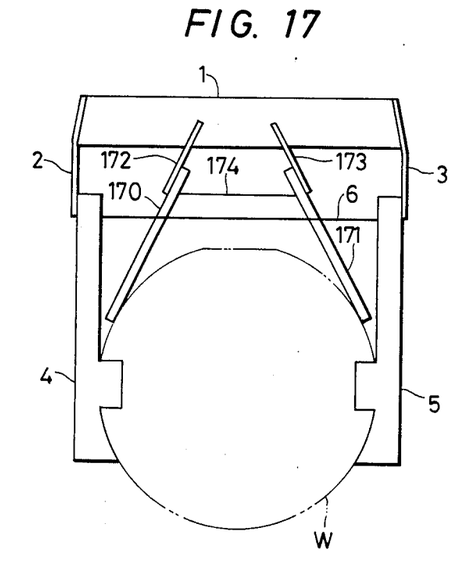

In FIG. 17, the third holding portion includes holder members 170, 171 which are adapted to be brought into touch or contact with two parts of the upper peripheral edge of the object or wafer W, elastic members 172, 173, which suspend the respective holder members 170, 171 from the base 1, and a member 174 of a shape memory alloy, is extended across the holder members 170, 171.

In the construction of the gripping device of FIG. 17, the holder members 170, 171 can apply pressing forces to the wafer W gripped by the grip members 4a, 5a or release the grip members 4a, 5a through the heating or cooling of the shape memory alloy member 174. Moreover, since the holder members 170, 171 exert the pressing forces toward a central part of the gripped wafer W, a positional deviation of the wafer W inside the grip members 4a, 5a can be suppressed. Furthermore, the wafer W can be gripped without any unreasonable force and may be caused to fall without undergoing any shock.

Figure 18:
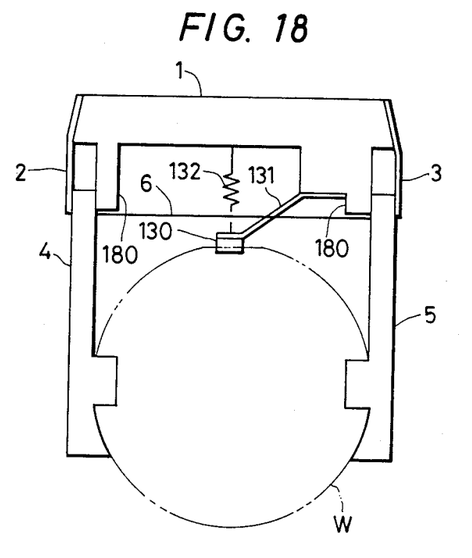

In the gripping device of FIG. 18, the base 1 is provided with stopper means which restrain or limit the magnitudes of the closing operations of the gripped members 4a, 5a. With a construction of a gripping device such as illustrated in FIG. 18, when the wafer is to be gripped by the grip members 4a, 5a, the interval between the grip members 4a, 5a can be maintained at a predetermined constant without depending upon the recovery forces of the shape memory alloy member 6. Consequntly, the grip members 4a, 5a can grip or grasp the wafer W with a fixed clearance therefrom so that the grip members 4a, 5a do not apply unless grasping forces to the wafer W.

As can readily be appreciated, the stopper means illustrated in FIG. 18 is also applicable to the above described gripping devices illustrated in FIGS. 14–17.

In the gripping device of FIG. 13, the initial flexures of the elastic members 2, 3 are afforded in the opening direction of the grip members 4a, 5a, while the grip members 4a, 5a are operated to close by tractive recovery forces of the shape memory alloy member 6, and the initial flexure of the elastic member 131 is afforded in the closing direction of the holder 130, while the holder 130 is operated in the opening direction by the tractive recovery forces of the shape memory alloy member 132. These aspects of the setting of initial flexures of the elastic members 2, 3, 131 and the shape memory of the shape memory alloy members 6 and 132 are also applicable to the embodiments illustrated in FIGS. 15 and 17. It is also possible to set the reverse characteristics to the above, in which the initial flexures of the elastic members 2, 3 are afforded in the closing direction of the grip members 4a, 5a while the grip members 4a, 5a are operated to open by the compressive recovery forces of the shape memory alloy members 6, and in which the initial flexure of the elastic member 131 is afforded in the opening direction of the holder member 130, while the holder member 130 is closed by the compressive recovery forces of the shape memory alloy member 132.

In the above described gripping devices of FIGS. 13–18, each of the shape memory alloy members 6, 132, 154, 155 and 174 is not restricted to a single linear member and, for example, a plurality of linear shaped memory alloy members 6 (FIG. 5), a pipe-shaped memory alloy member 60 (FIG. 6), taking cooling into consideration, and a flat shape memory alloy member 70 or 80 (FIGS. 7 or 8), arranged horizontally or vertically, may well be used. Additionally, to increase the movement magnitudes of the grip members 4a, 5a and/or the third holding portion based on the shape memory alloy members, it is possible to employ a curved flat shape memory alloy member 90 (FIG. 9), a corrugated shaped memory alloy member 100 (FIG. 10), and a linear shaped memory alloy member 110 or 120 having one or two loops (FIGS. 11 or 12).

Additionally, in all of the above-described gripping devices of the present invention, as an expedient for heating the shape memory alloy, it is possible to adopt, not only resistance heating, but also induction heating, heating based on a hot fluid, radiant heating based on a laser beam, an infrared radiation beam, or the like.

Since all of the above described embodiments of a gripping device of the present invention produce little if any contaminants such as, for example, dust, there are well suited to the handling of wafers in semiconductor production processes since, according to the present invention, an object to be grasped can be gripped without exerting any unreasonable force and is not subjected to a great impact force when the object falls, so that the damages to the object to be grasped such as, for example, a semiconductor wafer, can be considerably reduced. As a result, a handling is possible which enhances the quality control of the objects to be grasped.

Figure 19:
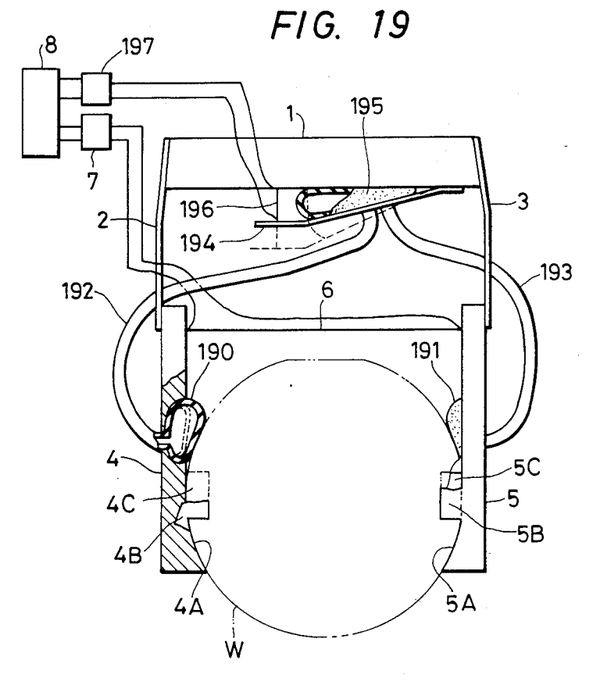
FIG. 19 is a partial cross-sectional front view of yet another embodiment of a grip device according to the present invention.

In FIG. 19, the grip device of the present invention includes a base 1, and grip members 4a, 5a respectively connected by elastic members 2, 3 with the grip members 4a, 5a being connected by a linear shape memory alloy member 6 such as, for example, a Ni-Ti alloy. Additionally, fixing portions 190, 191 for an object to be grasped, such as, for example, a semiconductor wafer W are formed as a pouch-like flexible member of high elasticity and are provided centrally of the end faces of the grip members 4a, 5a in opposition to each other. The fixing portions 190, 191 are connected through respective air tubes 192, 193 to a pneumatic section, described more fully hereinbelow, mounted on the base 1. The pneumatic section includes an elastic member 194 attached to the base 1, an air pressure applier 195 also constructed as a pouch-like flexible member, also fashioned as a pouch-like flexible member, which is held between the elastic member 194 and the base 1, and a shape memory alloy linear member 196 which couples the elastic member 194 and the base 1. The elastic members 2, 3 are provided with initial flexures for urging the grip member 4a, 5a in an opening direction so as to exert forces of deformation on the shape memory alloy member 6. Additionally, the elastic member 194 is previously provided or endowed with an initial flexure so as to exert a force of deformation on the shape memory alloy member 196.

Bent first holding portions 14A, 15A are disposed in opposition to each other and are adapted to hold the lower peripheral edge of the object to be grasped, i.e., a semiconductor wafer W. Two rows of protrusions are juxtaposed with regard to a sandwiching of the plane of the semiconductor wafer and are respectively formed above the bent holding portions 4A, 5A of the grip members 4a, 5a. The shape memory alloy members 6, 196, described above, are connected to a power source 8 through switches 7, 197, respectively.

In the gripping device of FIG. 19, when the shape memory alloy member 6 is heated, it generates forces of recovery against the deformation forces of the elastic members 2, 3, to draw the grip members 4a, 5a toward each other and to cause the grip members 4a, 5a to nip the lower peripheral parts of the semiconductor wafer W. In contrast, when the shape memory alloy member is cooled, the grip members 4a, 5a are opened by the deformation forces of the elastic members 2, 3 and the semiconductor wafer W is released. Additionally, when the shape memory alloy member 196 is heated so as to grip the object to be grasped, i.e., the semiconductor wafer W, the shape memory alloy member 196 generates forces of recovery against the deformation force of the elastic member 194, and the elastic member 194 warps to compress the air pressure applier 195. Consequently, the fixing members 190, 191 having their internal pressures raised are inflated, whereby the semiconductor wafer W is compressed and nipped between the fixing members 190, 191 and between the fixing portions 191 and the bent first holding portions 14A, 15A of the grip members 4a, 5a. When the shape memory alloy member 196 is cooled, the compression of the air pressure applier 195 is released by the deformation force of the elastic member 194 as indicated in phantom line in FIG. 19. Consequently, the fixing members 190, 191 have their internal pressures reduced and are deflated so that the semiconductor wafer W is free in a longitudinal direction of the grip members 4a, 5a.

According to the embodiment of FIG. 19, the semiconductor wafer W can be gripped and fixed without any unreasonable stress and can assume any desired attitude due to the soft elastic forces of the fixing members 190, 191. Additionally, in an operation wherein the gripping device is caused to descend or be lowered so as to place the semiconductor wafer W on a jig or the like, the fixing members 190, 191 are deflated to set the semiconductor wafer W free in the vertical direction so that a collision speed between the jig and the semiconductor wafer W can be controlled as the descent speed of the gripping device whereby a tipping of the semiconductor wafer which is attributed to the drop thereof can reliably be prevented.

In the embodiment of FIG. 19, as can readily be appreciated, the specific configuration of the shape memory alloy members 6, 196 may be, for example, a linear form, an arcuate form, a flat form, a pipe form, etc., as described hereinabove in connection with the gripping device of FIGS. 5–12. Additionally, each of the elastic members 2, 3 and 94 may be in a form of a leaf spring, a coil spring, and a torsion spring. Moreover, the grip device of FIG. 19 may be so constructed that the initial flexures of the elastic members 2, 3 are afforded in the closing direction of the grip members 4a, 5a, whereupon the grip members 4a, 5a are opened by the compressive recovery forces of the shape memory alloy member 6. Furthermore, the grip device may also be constructed so that the initial flexure of the elastic member 194 is afforded in the direction of compression of the air pressure supplier 195, whereupon the air pressure supplier 195 is released by the compressive recovery forces of the shape memory alloy member 196. With regard to the heating of the shape memory alloy member 6 or 196, it is also possible, as noted hereinabove with regard to the previously described gripping devices, to employ any method such as resistance heating, induction heating of the material itself, heating with a hot fluid, radiant heating with a laser beam or an infrared radiation beam or the like.

Figure 20:
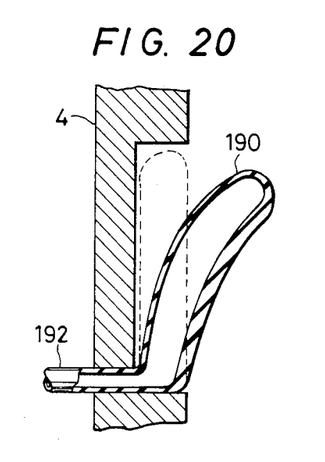
FIG. 20 is a cross-sectional detail view of a fixing portion for the grip device of FIG. 19.

As shown in FIG. 20, the fixing member or portion 190 is thickened on a side facing the center of the gripping device. By virtue of such construction, the fixing portions 190, 191 bend toward the center of the gripping device as the internal pressures thereof rise. As shown in FIG. 20, the contact areas between the fixing portions 190, 191 and the upper peripheral parts of the semiconductor wafer W can be enlarged to relieve the concentration of stresses at the compression and to stably grip the semiconductor wafer W.

Figure 21:
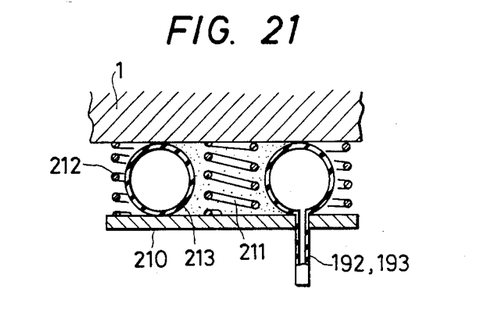
FIGS. 21 and 22 are cross-sectional views respectively showing examples of a pneumatic portion for the grip device of FIG. 19.

FIG. 21 provides another example of a pneumatic section constructed in accordance with the present invention, wherein the pneumatic section is so constructed that the base 1 and the keeper plate 210 are coupled by a shape memory alloy member 211 and an elastic member 212 which are formed as coil members such as, for example, coil springs or the like, and an air pressure applier 23 is fashioned as a doughnut-like flexible member and is held between the base 1 and the keeper plate 210. An interspace between the base 1 and keeper plate 210 changes in accordance with the balance between the deformation force of the elastic member 212 and the recovery forces of the shape memory alloy member 211 changing in dependence upon temperatures, with the result being that the air pressure in the air pressure applier 213 changes.

Figure 22:
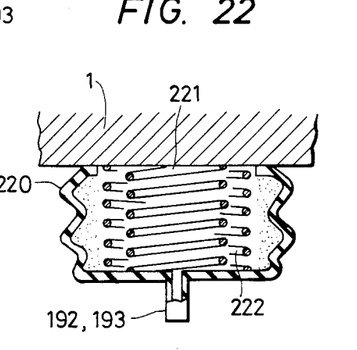

FIG. 22 provides yet another example of a pneumatic section for a gripping device constructed in accordance with the present invention wherein the pneumatic section is constructed so that an air pressure applier 220, fashioned as a bellows-like flexible member, is fixed to the base 1, with an unfixed end face of the air pressure applier 220 and the base 1 being coupled by a shape memory alloy member 221 and an elastic member 222 which are in the form of a coiled elastic member such as, for example, a coil spring. An interspace between the base 1 and the end face between the base 1 and the end face of the air pressure applier 220 changes in accordance with a balance between the deformation force of the elastic member 222 and the recovery forces of the shape memory alloy member 221 which changes in dependence upon temperatures, thereby resulting in the air pressure in the air pressure applier 220 changing.

In the embodiments described above in connection with FIGS. 21 and 22, the shape memory alloy members 211, 221 and the elastic members 212, 222 may well be constructed in forms other than that of coils and, for example, may assume a linear form, flat form, or pipe-shaped form. The air pressure applier 213, 220 may be made of an elastic material so as to fulfill the function of the elastic members 212, 222.

Figure 23:
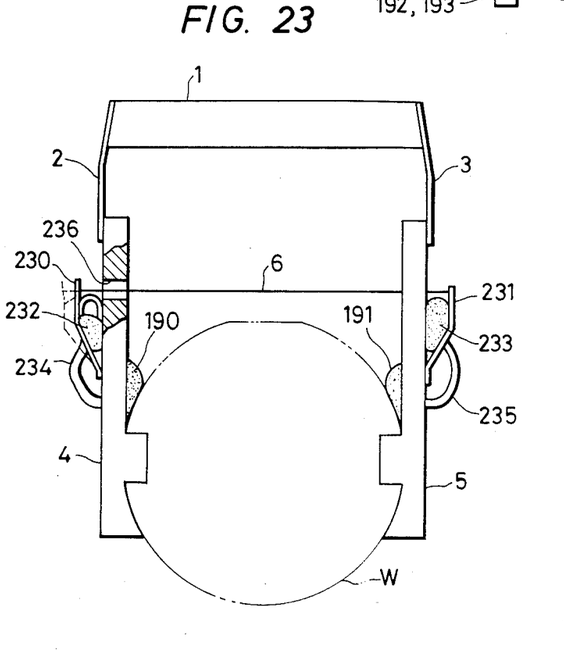
FIG. 23 is a front view, partially in cross section, illustrating another embodiment of a grip device of the present invention shown in FIG. 19.

In the embodiment of the gripping device in FIG. 23, a pneumatic section is constructed of another elastic member 230 or 231 one end of which is fixed to the side of the corresponding grip members 4a, 5a remote from the gripping surface thereof and the other end of which has a corresponding end of a shape memory alloy member 6 coupled thereto. An air pressure applier 232 or 233, fashioned as a pouch-like flexible member, is disposed between the elastic member 230 or 231 and the grip member 4a or 5a respectively, with the air pressure appliers 232, 233 being respectively coupled to the fixing members 190, 191 by air tubes 234, 235, respectively. Additionally, the shape memory alloy member 6 is connected to the elastic members 230, 231 by passing through holes or openings 236 provided in the respective grip members 4a, 5a. With the construction of FIG. 23, the elasticity of the other elastic members 230, 231 is set higher than that of the elastic members 2, 3. Then, after a grip of the grip members 4a, 5a has been completed by the recovery forces of the shape memory alloy 6, the air pressure appliers 232, 233 are compressed to inflate the fixing members 190, 191 and to fix the semiconductor wafer W.

According to the gripping device of FIG. 23, the pneumatic sections can be driven by the shape memory alloy member 6 for driving the grip members 4a, 5a so that the structure is simplified. Moreover, the successive sequence operations of gripping and fixing the semiconductor wafer W can be realized only by controlling the shape memory alloy member 6. In the embodiment of FIG. 23, the pneumatic section may well be disposed only on one side of the grip members 4a, 5a.

Figure 24:
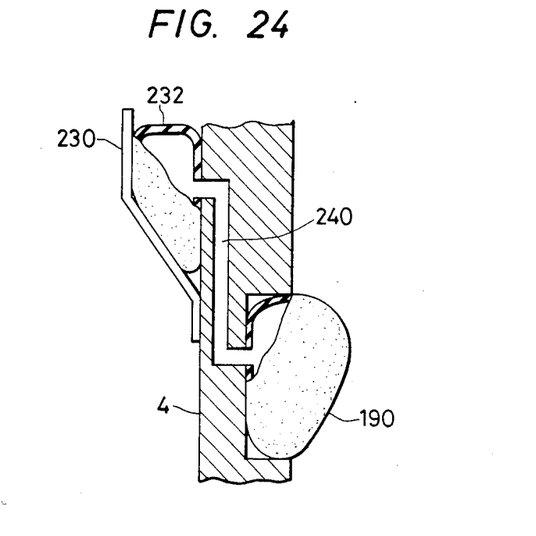
FIG. 24 is a cross-sectional view illustrating a coupling construction of a pneumatic portion and a fixing portion of the gripping device shown in FIG. 23.

As shown in FIG. 24, air passages 240 may be formed in the grip members 4a, or 5a in order to couple the air pressure appliers 232, 233 and the fixing members 190, 191 in the gripping device illustrated in FIG. 23. With the arrangement of FIG. 24, the air tubes need not be disposed outside and it is possible to prevent the production of dust by a deformation breakdown of the air tube or adherence of the dust on a surface of the air tube.

Figure 25:
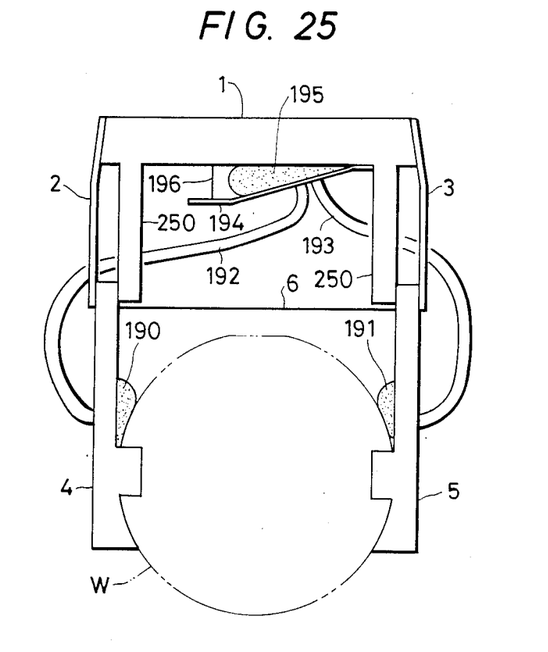
FIG. 25 is a front view of still another embodiment of a gripping device of the present invention.

FIG. 25 provides another example of a gripping device of the present invention similar to the gripping device of FIG. 23. In the gripping device of FIG. 25, the base 1 is provided with protuberances 250 which touch or contact opposing end faces of the grip members 4a, 5a at the time of the grip. By the arrangement of FIG. 25, an interval between the grip members 4a, 5a, at the time of the gripping action, can be at a predetermined constant level regardless of the recovery forces of the shape memory alloy member 6, and the semiconductor wafer W can be nipped or grasped with fixed clearances.

As described above, and in accordance with the present invention, a gripping device is driven by a spring and a shape memory material and does not include any substantial mechanical sliding portions so that the production of contaminants such as dust which occurs during operation of the gripping device can be avoided if not substantially reduced. Additionally, due to a construction in which the peripheral parts of the semiconductor wafer are nipped or grasped by the grip members, physical damages to the surface of the wafer can be avoided or considerable lessened.

Moreover, by virtue of the features of the present invention, it is possible to provide a gripping device which is relatively thin and which is also well suited for enabling an introduction to a semiconductor manufacturing process.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:

1. A gripping means for gripping an outer peripheral edge of a sheet-like object, the gripping means comprising a base means, grip members mounted on said base means for gripping the object, elastic means disposed on respective sides of the base means for respectively connecting said grip members to said base means so as to urge the respective grip members in one of an opening and closing direction, at least one shape memory means for coupling said grip members to each other, and a power source connected to said shape memory means through a switch means.

2. A gripping means according to claim 1, further comprising another shape memory alloy means extending between said base means and one of said grip members for coupling said base means to said one of said grip members.

3. A gripping means according to claim 1, further comprising a pair of protrusion means, each of said protrusion means including an end face disposed in opposition to a respective grip member, the respective end face of each of said protrusion means being adapted to come into contact with an associated grip member when the object is gripped.

4. A gripping means according to claim 1, wherein said at least one shape memory alloy means is a linear member adapted to drive said grip members.

5. A gripping means according to claim 1, wherein said at least one shape memory alloy means is a flat member adapted to drive said grip members.

6. A gripping means according to one of claims 1 or 3, wherein said at least one shape memory alloy means includes a pipe-shaped member of a shape memory alloy material.

7. A gripping means according to one of claims 1 or 3 wherein said at least one shape memory alloy means includes a linear member having at least one looped portion.

8. A gripping means according to claim 1, further comprising means for urging the object in a direction toward distal ends of the respective grip members including at least a pair of holder members respectively adapted to engage spaced outer peripheral edge portions of the object, and means for pressing said holder members against the peripheral edge of the object.

9. A gripping means according to claim 8, wherein said holder members each include a first end mounted on opposed end faces of the respective grip members, and wherein said means for pressing includes at least a pair of shape memory alloy members respectively interposed between the holder members and associated grip members.

10. A gripping means for gripping an outer peripheral edge of a sheet-like object, the gripping means comprising a base means, grip members mounted on said base means for gripping the object, elastic means disposed on respective sides of the base means for respectively connecting said grip members to said base means so as to urge the respective grip members in one of an opening and closing direction, at least one shape memory means for coupling said grip members to each other, means for urging the object in a direction toward distal ends of the respective grip members including a holder member adapted to conduct at least one portion of an outer peripheral edge of the object, and drive means interposed between said holder member and base means for pressing said holder member against the object, and wherein said drive means for pressing said holder member includes an elastic means for urging said holder member to move, and a shape memory alloy member adapted to operate in opposition to said elastic means urging said holder to move.

11. A gripping means for gripping an outer peripheral edge of a sheet-like object, the gripping means comprising a base means, grip members mounted on said base means for gripping the object. elastic means disposed on respective sides of the base means for respectively connecting said grip members to said base means so as to urge the respective grip members in one of an opening and closing direction, at least one shape memory means for coupling said grip members to each other, means for urging the object in a direction toward distal ends of the respective grip members including a holder member adapted to conduct at least one portion of an outer peripheral edge of the object, and drive means interposed between said holder member and base means for pressing said holder member against the object, and wherein said drive means for pressing said holder member includes a shape memory alloy member for moving said holder member.

12. A gripping means according to one of claims 11 or 3, wherein said at least one shape memory alloy means includes a corrugated flat member of a shape alloy material.

13. A gripping means for gripping an outer peripheral edge of a sheet-like object, the gripping means comprising a base means, grip members mounted on said base means for gripping the object, elastic means disposed on respective sides of the base means for respectively connecting said grip members to said base means so as to urge the respective grip members in one of an opening and closing direction, at least one shape memory means for coupling said grip members to each other, means for urging the object in a direction toward distal ends of the respective grip members, and wherein said means for urging includes a holder member adapted to contact at least one portion of the outer peripheral edge of the object, and a drive means interposed between said holder member and an associated grip member for pressing said holder member against the object.

14. A gripping means according to claim 13, wherein said drive means for pressing said holder member includes an elastic means for movably urging said holder member, and a shape memory alloy member adapted to operate in opposition to said elastic means movable urging said holder member.

15. A gripping means according to claim 14, wherein said drive means for pressing said holder member includes a shape memory alloy member for moving said holder member.

16. A gripping means for gripping an outer peripheral edge of a sheet-like object, the gripping means comprising a base means, grip members mounted on said base means for gripping the object, elastic means disposed on respective sides of the base means for respectively connecting said grip members to said base means so as to urge the respective grip members in one of an opening and closing direction, at least one shape memory means for coupling said grip members to each other, means disposed on opposed confronting end faces of said grip member for flexibly pressing the object between said grip members during a gripping operation, said means for flexibly pressing including a flexible pouch-like fixing portion disposed on each of the opposed confronting end faces of the grip members, and at least one pneumatic means for applying pneumatic pressure to the respective fixing portions through means connecting said pneumatic means and the respective fixing portions, opposed end faces of distal ends with the respective grip members are provided with holding portions bent towards the base means and adapted to engage portions of an outer peripheral edge of the object, two rows of protrusion means provided along a longitudinal extent of the confronting end faces of the respective grip members, and wherein said pneumatic means includes an air pressure supply means fashioned as a pouch-like flexible member interposed between the base means and a keeper plate means coupled to said base means by another shape memory alloy member and another elastic means arranged in parallel.

17. A gripping means for gripping an outer peripheral edge of a sheet-like object, the gripping means comprising a base means, grip members mounted on said base means for gripping the object, elastic means disposed on respective sides of the base means for respectively connecting said grip members to said base means so as to urge the respective grip members in one of an opening and closing direction, at least one shape memory means for coupling said grip members to each other, means disposed on opposed confronting end faces of said grip member for flexibly pressing the object between said grip members during a gripping operation, said means for flexibly pressing including a flexible pouch-like fixing portion disposed on each of the opposed confronting end faces of the grip members, and at least one pneumatic means for applying pneumatic pressure to the respective fixing portions through means connecting said pneumatic means and the respective fixing portions, opposed end faces of distal ends with the respective grip members are provided with holding portions bent towards the base means and adapted to engage portions of an outer peripheral edge of the object, two rows of protrusion means provided along a longitudinal extent of the confronting end faces of the respective grip members, and wherein said pneumatic portion includes an air pressure supply means fashioned as a pouch-like elastic member interposed between said base means and a keeper plate means by another shape memory alloy member.

18. A gripping means for gripping an outer peripheral edge of a sheet-like object, the gripping means comprising a base means, grip members mounted on said base means for gripping the object, elastic means disposed on respective sides of the base means for respectively connecting said grip members to said base means so as to urge the respective grip members in one of an opening and closing direction, at least one shape memory means for coupling said grip members to each other, means disposed on opposed confronting end faces of said grip member for flexibly pressing the object between said grip members during a gripping operation, said means for flexibly pressing including a flexible pouch-like fixing portion disposed on each of the opposed confronting end faces of the grip members, and at least one pneumatic means for applying pneumatic pressure to the respective fixing portions through means connecting said pneumatic means and the respective fixing portions, opposed end faces of distal ends with the respective grip members are provided with holding portions bent towards the base means and adapted to engage portions of an outer peripheral edge of the object, two rows of protrusion means provided along a longitudinal extent of the confronting end faces of the respective grip members, and wherein said pneumatic means includes an air pressure supply means fashioned as a bellows-like flexible member having one end connected to the base means and another end of the bellows-like flexible member and said base member means are coupled by another shape memory alloy member and another elastic member arranged in parallel.

19. A gripping means for gripping an outer peripheral edge of a sheet-like object, the gripping means comprising a base means, grip members mounted on said base means for gripping the object elastic means disposed on respective sides of the base means for respectively connecting said grip members to said base means so as to urge the respective grip members in one of an opening and closing direction, at least one shape memory means for coupling said grip members to each other, means disposed on opposed confronting end faces of said grip member for flexibly pressing the object between said grip members during a gripping operation, said means for flexibly pressing including a flexible pouch-like fixing portion
disposed on each of the opposed confronting end faces of the grip members, and at least one pneumatic means for applying pneumatic pressure to the respective fixing portions through means connecting said pneumatic means and the respective fixing portions, opposed end faces of distal ends with the respective grip members are provided with holding portions bent towards the base means and adapted to engage portions of an outer peripheral edge of the object, two rows of protrusion means provided along a longitudinal extent of the confronting end faces of the respective grip members, and wherein said pneumatic means includes an air pressure supply means fashioned as a bellows-like flexible member having one end connected to the base means and the other end thereof and the base means being coupled by another shape memory alloy member.

20. A gripping means for gripping an outer peripheral edge of a sheet-like object, the gripping means comprising a base means, grip members mounted on said base means for gripping the object, elastic means disposed on respective sides of the base means for respectively connecting said grip members to said base means so as to urge the respective grip members in one of an opening and closing direction, at least one shape memory means for coupling said grip members to each other, means disposed on opposed confronting end faces of said grip member for flexibly pressing the object between said grip members during a gripping operation, and wherein said pneumatic means includes another elastic member having one end fixed to one of the grip members and an opposite end fixed to said shape memory alloy means, and an air pressure supply means fashioned as a pouch-like flexible member interposed between said another elastic member and an associated grip member.

21. A gripping means for gripping an outer peripheral edge of a sheet-like object, the gripping means comprising a base means, grip members mounted on said base means for gripping the object, elastic means disposed on respective sides of the base means for respectively connecting said grip members to said base means so as to urge the respective grip members in one of an opening and closing direction, at least one shape memory means for coupling said grip members to each other, means disposed on opposed confronting end faces of said grip member for flexibly pressing the object between said grip members during a gripping operation, said means for flexibly pressing including a flexible pouch-like fixing portion disposed on each of the opposed confronting end faces of the grip members, and at least one pneumatic means for applying pneumatic pressure to the respective fixing portions through means connecting said pneumatic means and the respective fixing portions, opposed end faces of distal ends with the respective grip members are provided with holding portions bent towards the base means and adapted to engage portions of an outer peripheral edge of the object, two rows of protrusion means provided along a longitudinal extent of the confronting end faces of the respective grip members, and wherein said pneumatic means includes an air pressure supply means fashioned as a pouch-like elastic member having on end coupled to one end of said shape memory alloy means and another end connected to one of said grip members.

22. A gripping means according to one of claims 16–21 wherein a side wall of the pouch-like flexible member adapted to contact the associated grip member is thinner than a side wall opposite thereto not in contact with the grip member.

23. A gripping means according to one of claims 20 or 21, wherein said means connecting said pneumatic means includes a tube means formed in at least one of said grip members.

24. A gripping means according to one of claims 16–21, wherein said base means includes a protuberance means adapted to contact opposed end faces of the grip members when the object is gripped.

* * * * *